(12) United States Patent
Többen et al.

(10) Patent No.: US 6,765,248 B2
(45) Date of Patent: Jul. 20, 2004

(54) FIELD EFFECT TRANSISTOR AND FABRICATION METHOD

(75) Inventors: Dirk Többen, Munich (DE); Thomas Schuster, Dresden (DE)

(73) Assignee: Infineon Technologies AG, Munich (DE)

(*) Notice: Subject to any disclaimer, the term of this patent is extended or adjusted under 35 U.S.C. 154(b) by 9 days.

(21) Appl. No.: 10/304,134

(22) Filed: Nov. 25, 2002

(65) Prior Publication Data

US 2003/0098478 A1 May 29, 2003

(30) Foreign Application Priority Data

Nov. 23, 2001 (DE) .......................................... 101 57 538

(51) Int. Cl.[7] .............................................. H01L 29/76

(52) U.S. Cl. ........................ 257/288; 257/331; 257/368; 257/377

(58) Field of Search ................................. 257/288, 331, 257/368, 377

Primary Examiner—Fetsum Abraham
(74) Attorney, Agent, or Firm—Laurence A. Greenberg; Werner H. Stemer; Ralph E. Locher

(57) ABSTRACT

A field effect transistor contains a gate stack with a first layer, preferably a polysilicon layer, on a gate oxide disposed on a substrate, and over the first layer, a second layer, preferably a silicide layer, is provided. Next to the gate electrode is a contact that is separated from the layers of the gate electrode by a layer containing silicon and a spacer layer. Therefore a recrystallization in the silicide layer at elevated temperatures is prevented, which would otherwise cause bulging of the silicide layer toward the contact. It thus prevents shorts between the gate electrode and the contact.

5 Claims, 7 Drawing Sheets

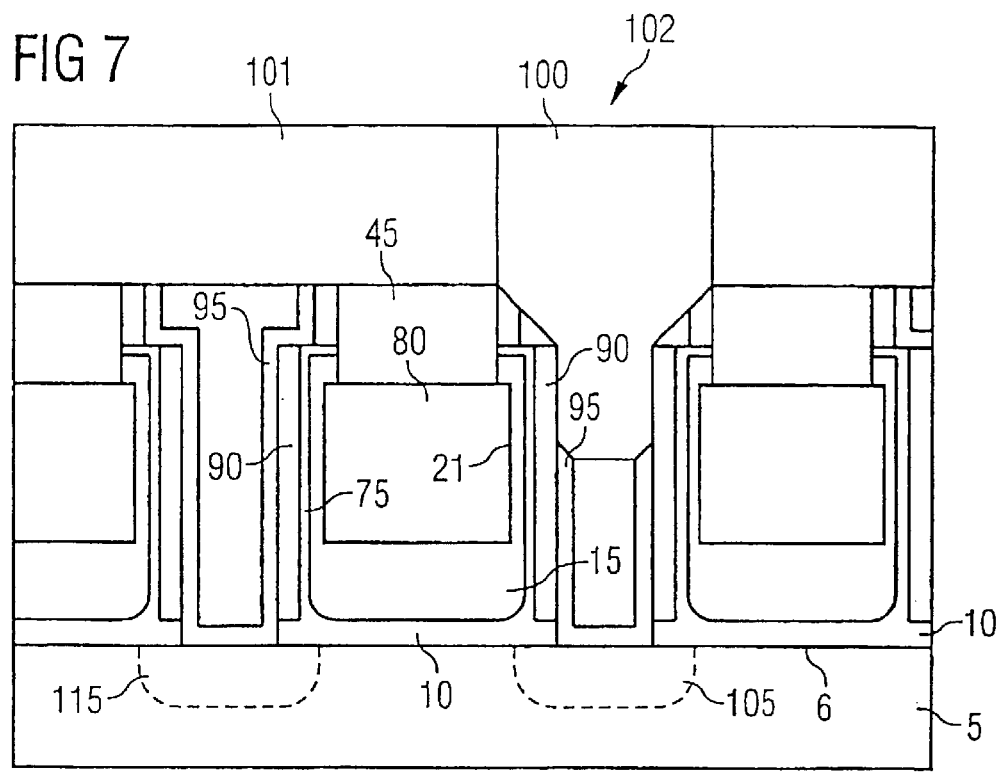
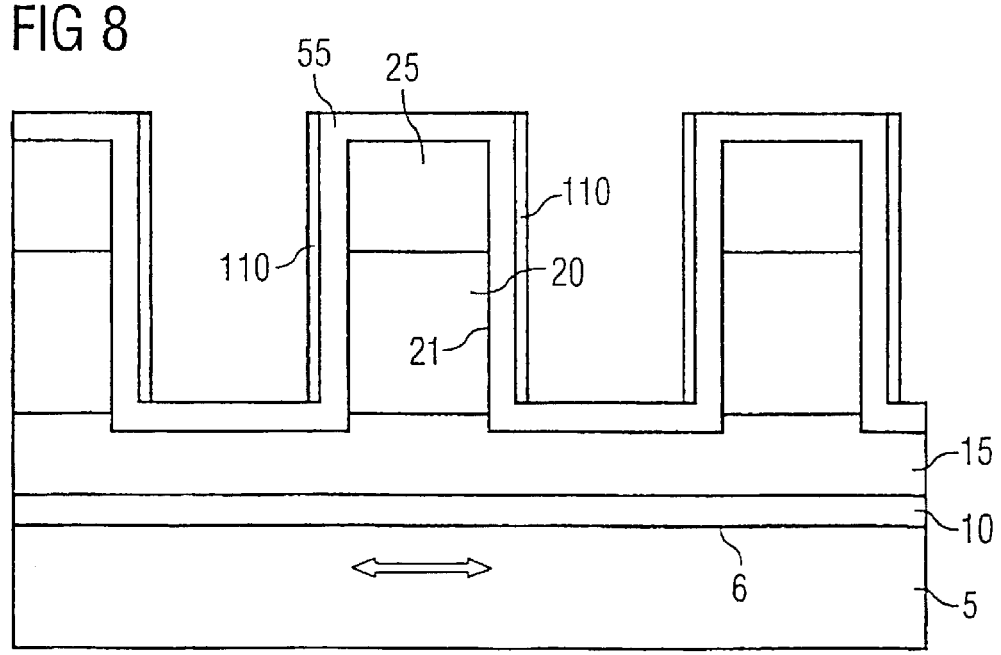

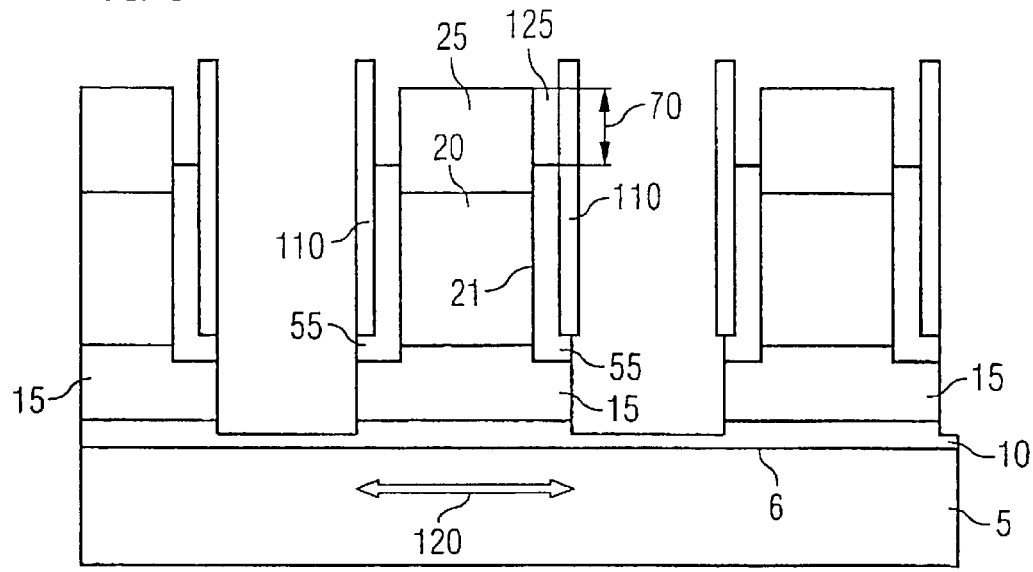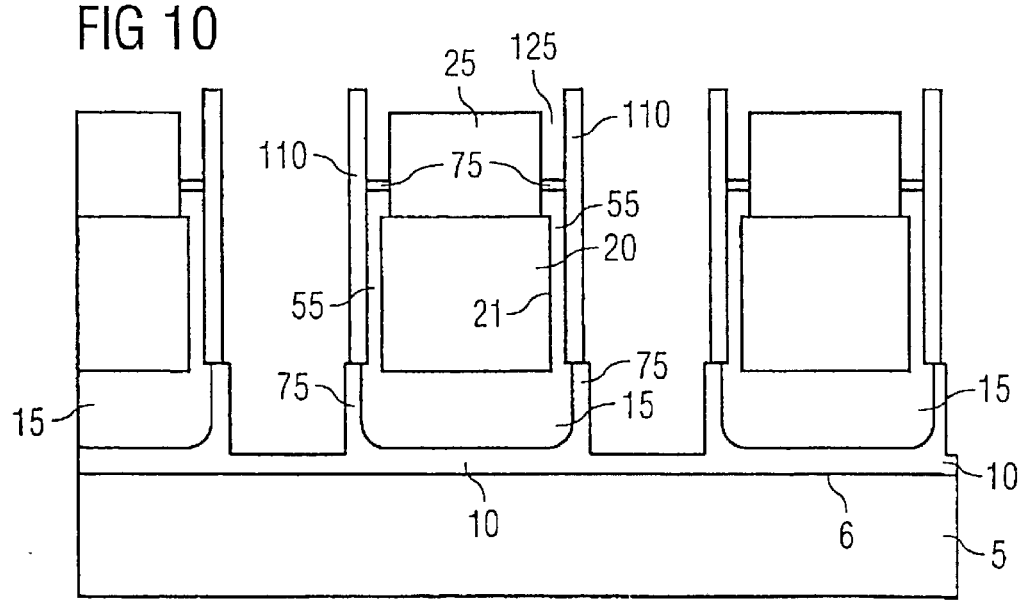

FIELD EFFECT TRANSISTOR AND FABRICATION METHOD

BACKGROUND OF THE INVENTION

Field of the Invention

The present application relates to a field effect transistor with a gate electrode and a method for fabricating the FET.

In the technical field of semiconductor components such as field effect transistors, it is customary and necessary to produce a conductive contact with a doped region in a semiconductor substrate. In the cell field of a semiconductor memory with dynamic cells (DRAM), in particular, two neighboring gate electrodes of two adjacent field effect transistors are disposed next to one another on the surface of a semiconductor substrate, with a doping zone disposed in the semiconductor substrate between the two gates. The surfaces and sidewalls of the two gates are respectively covered with what are known as spacers as self-aligning etch masks in order to form self-aligning contact between the two gates to the doping zone. A spacer is formed by back-etching a thin, optimally conformally deposited layer, known as a liner.

Typically, the spacers are formed from silicon nitride as envelopes around the two gates, and the gates are formed from polycrystalline silicon. The gates and the substrate are usually covered with a silicon oxide that includes vias. A selective etching between the silicon oxide layer and the silicon nitride spacer is utilized to form the vias. It is possible that the mask which serves for structuring the vias between the two gates could be misaligned, so that a via which is etched with the structured mask is formed not only between the gates but also in one of them. This is prevented by the silicon nitride spacers, because the etching of the via is guided between the two gates by the spacers, which have a substantially lower etch rate than the silicon oxide. The two gates are thus protected against contact etching by the silicon nitride spacers.

As is generally known, the gate of the field effect transistor can be formed from not just one layer but a layer sequence, also referred to as a gate stack. For instance, a gate stack contains a heavily doped polycrystalline silicon layer, which is disposed on a gate oxide, and a layer with very low resistivity, which is disposed on the polycrystalline silicon layer and contains a metal and/or a metal silicide, for instance tungsten and/or tungsten silicide.

For fabrication, a structured gate stack is usually subjected to a temperature step at an elevated temperature in an oxygen atmosphere, whereby exposed polycrystalline silicon is oxidized, forming an isolating layer, and furthermore a recrystallization of the tungsten silicide layer occurs. The disadvantage of the recrystallization of the tungsten silicide layer is that a volume enlargement of the tungsten silicide occurs because of the rearranged microscopic structure. The volume enlargement looks similar to a swelling process and extends in a bulging fashion into the via where the contact is to be formed. The bulging of the tungsten silicide layer into the via shortens the distance between the contact and the tungsten silicide layer, which can lead to shorts between the gate electrode and the contact material.

SUMMARY OF THE INVENTION

It is accordingly an object of the invention to provide a field effect transistor and a fabrication technique that overcome the above-mentioned disadvantages of the prior art devices and methods of this general type, which has a low resistance gate and can be flawlessly fabricated.

With the foregoing and other objects in view there is provided, in accordance with the invention, a field effect transistor. The transistor contains a substrate having a surface, a first doping region, a second doping region, and a channel disposed between the first doping region and the second doping region. A gate oxide is disposed on the surface of the substrate over the channel. A gate electrode is provided and has a side wall, a first layer of polycrystalline doped silicon disposed on the gate oxide, and a second layer disposed on the first layer. An insulating spacer layer is disposed on the sidewall of the gate electrode. A contact adjoins the gate electrode and is insulated from the gate electrode by the insulating spacer layer. The contact makes contact with one of the first and second doping regions. A layer containing silicon is disposed between the gate electrode and the contact.

The layer containing silicon which is disposed between the second layer of the gate electrode and the contact plug serves as a guard layer for the second layer of the gate electrode, by which recrystallizations of the second gate electrode are reduced or prevented, for example. As a result, the volume expansion thereof can be reduced, thereby improving the safety gap between the gate stack and the contact plug.

According to an advantageous development of the field effect transistor, the layer containing silicon is either polycrystalline or amorphous.

According to another advantageous development of the inventive field effect transistor, the second electrode contains tungsten, tungsten silicide, tungsten nitride, or cobalt silicide. These materials are advantageously suitable for constructing a low-resistance gate stack, because these materials for the second gate electrode have a lower resistance than a polycrystalline doped silicon layer.

According to another advantageous development of the inventive field effect transistor, a silicon oxide layer is disposed between the layer containing silicon and the contact plug. The silicon oxide layer serves as an additional spacer and emerges in the thermal oxidation of the first gate electrode.

According to another advantageous development of the invention, a silicon nitride layer is disposed between the silicon layer and the contact plug. The additional silicon nitride layer likewise produces improved protection for the gate stack in the etching of the via. The silicon nitride layer is advantageously disposed such that it protects the region of the gate stack which is averted from the surface of the substrate and which is therefore damaged most by the etchant in the etching of the via.

With the foregoing and other objects in view there is provided, in accordance with the invention, a method for fabricating a field effect transistor. The method includes the steps of providing a substrate having a surface, forming a gate oxide on the surface, and depositing a first layer for a gate electrode on the gate oxide. The first layer contains a polycrystalline doped silicon. A second layer for the gate electrode is deposited on the first layer. The second layer is structured, leaving the first layer at least partly clear and forming a sidewall at the second layer extending substantially perpendicular to the surface of the substrate. A layer containing silicon is deposited on the sidewall of the second layer and on an exposed portion of the first layer. A structuring step is performed such that the first layer gets structured and the structuring extends into the gate oxide but leaves intact the layer containing silicon at the sidewall of the second gate electrode. A dopant is incorporated into the substrate for forming a first doping region and a second doping region. An insulating spacer layer is formed on the sidewall of the second layer and extends to the first and second doping regions. A contact is formed and adjoins the insulating spacer layer, the contact makes contact with one of the first and second doping regions.

By this technique, a field effect transistor is advantageously formed which is less susceptible to shorts between the gate stack and the contact plug. This improves the yield of produced circuits as well as the reliability of the individual circuits. At the same time, the gate has low resistivity.

According to an advantageous development of the inventive method, a thermal oxidation is carried out after the deposition of the layer containing silicon. The thermal oxidation serves for oxidizing the first gate electrode, which consists of polycrystalline silicon, at its surface, whereby an isolating layer is formed.

According to another advantageous development of the inventive method, the isolating spacer layer is deposited as a silicon nitride layer. The isolating spacer layer is advantageously suitable as a self-aligning etch mask in the forming of the via. A spacer is a thin layer located at a substantially vertical surface.

According to another advantageous development of the inventive method, an insulating liner layer is deposited on the insulating spacer layer as a silicon oxynitride layer. A liner is a conformal thin layer that is deposited surface-wide. The portions remaining after a structuring process contain vertical and horizontal sections. The insulating liner layer likewise improves the reliability of the formed field effect transistors, because the insulation between the gate stack and the contact plug is improved. Besides this, the determination of the endpoint of the etching process is facilitated.

According to another advantageous development of the inventive method, an additional insulating liner layer is deposited on the layer containing silicon prior to the structuring of the first gate electrode, and the additional layer is etched back as an additional spacer. The additional insulating liner layer, that is to say the additional spacer, improves the insulation and the etch mask for forming the self-aligning via in the region of the second gate electrode. Specifically, the additional insulating liner layer is deposited on the side of the second gate electrode that is averted from the substrate surface for purposes of increasing the distance between the gate stack and the subsequently inserted contact.

Other features which are considered as characteristic for the invention are set forth in the appended claims.

Although the invention is illustrated and described herein as embodied in a field effect transistor and a fabrication technique, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 7 is a sectional view of the configuration according to FIG. 6 with a contact plug;

FIG. 8 is a sectional view of another exemplifying embodiment that follows FIG. 3 in the processing order;

FIG. 9 is a sectional view of the configuration according to FIG. 8 after an additional etching step;

FIG. 10 is a sectional view of the configuration according to FIG. 9 after an oxidation step;

DESCRIPTION OF THE PREFERRED EMBODIMENTS

Figure 1:
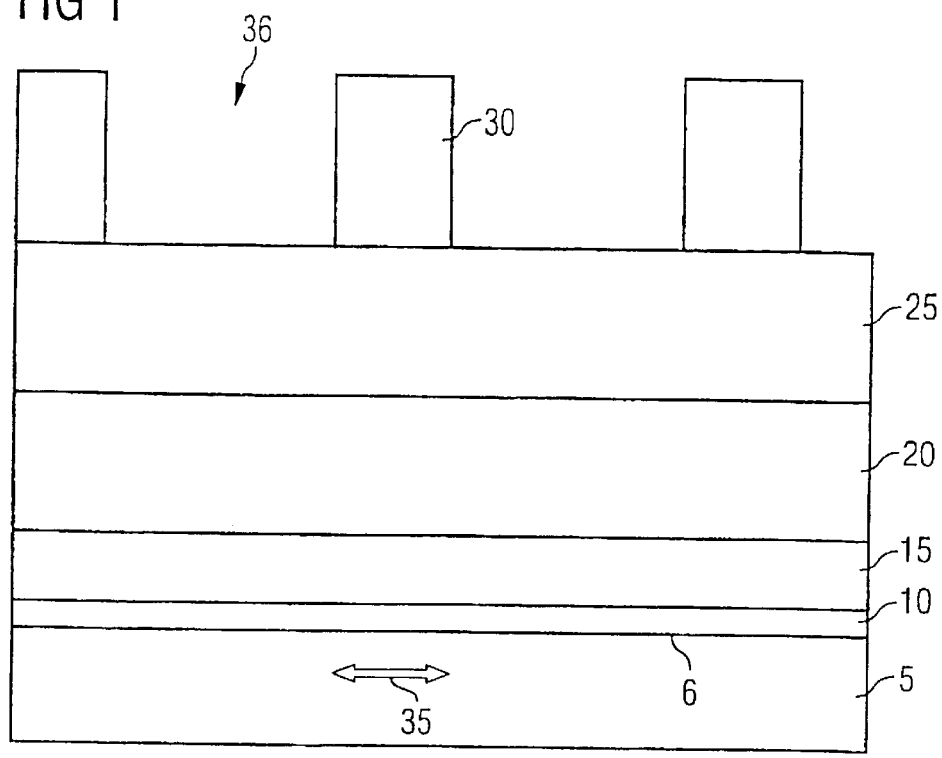
FIG. 1 is a diagrammatic, sectional view of a substrate with a layer sequence that can be structured as a gate stack, and a varnish mask that has already been structured according to the invention.

Referring now to the figures of the drawing in detail and first, particularly, to FIG. 1 thereof, there is shown a substrate 5 which has a surface 6 and is n-doped or p-doped. The substrate 5 is a monocrystalline silicon substrate. A gate oxide 10 is disposed on the surface 6. From the gate oxide 10, a first layer 15, preferably a heavily doped polycrystalline silicon layer, is configured. Disposed on the first layer 15 is a second layer 20, for instance a layer containing tungsten, tungsten silicide, tungsten nitride, or cobalt silicide. A mask layer 25 is disposed on the second layer 20. The mask layer 25 contains silicon nitride as a hard mask. Disposed on the mask layer 25 is a structured photoresist layer 30 which contains a first dimension 35 and in which a trench 36 is formed.

Figure 2:
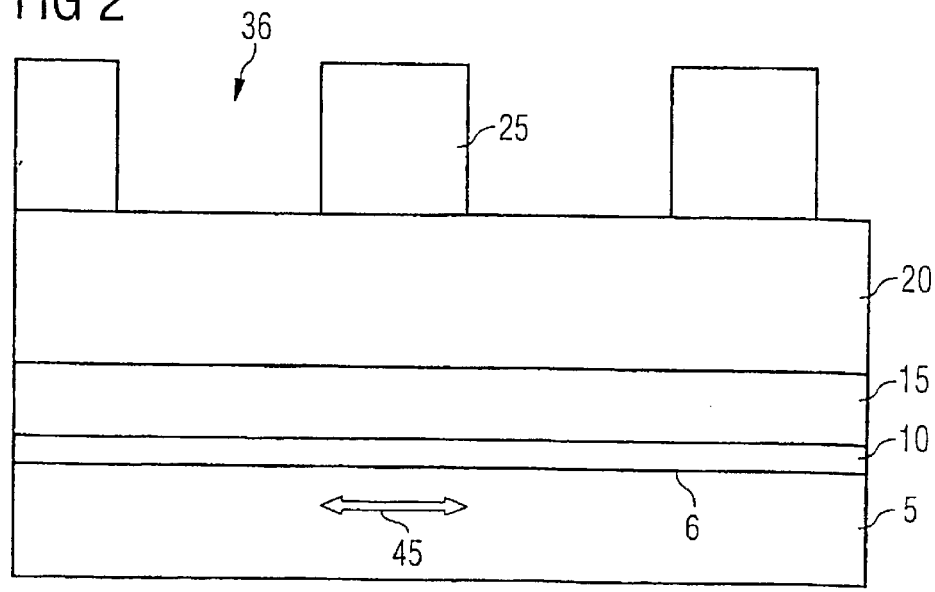
FIG. 2 is a sectional view of the layer stack after a structuring has been performed.

Turning to FIG. 2, the configuration from FIG. 1 is processed such that the mask layer 25 is etched with the aid of the structured photoresist mask 30, and a structured mask layer 25 is formed. The structured mask layer 25 is referred to as a hard mask. The structures of the mask layer 25 are represented as a second dimension 45. The photoresist 30 is then removed. The trench 36 is thus transferred into the structured mask layer 25.

Figure 3:
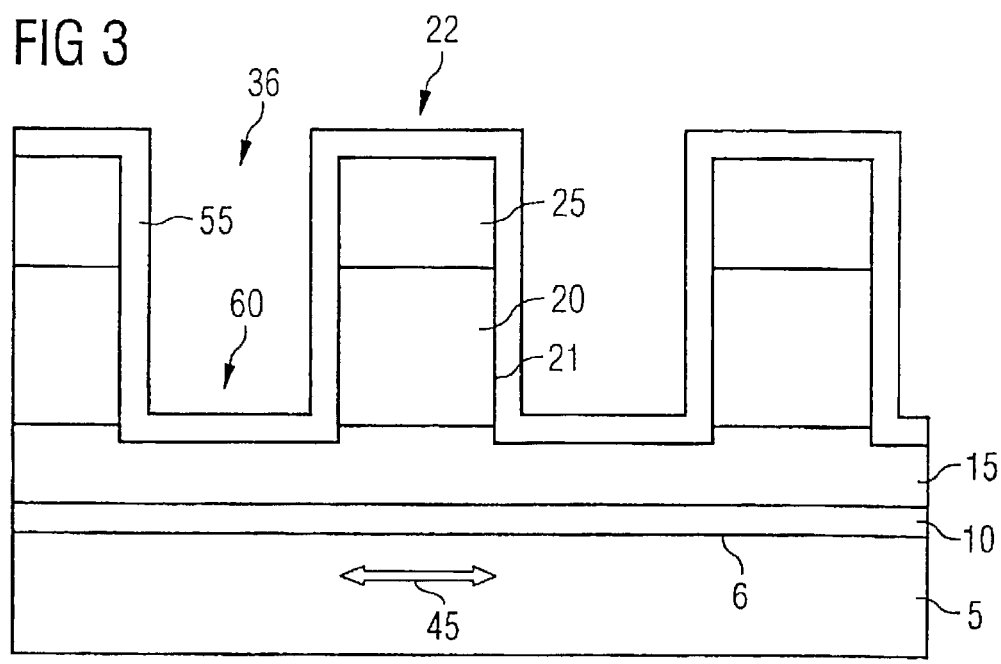
FIG. 3 is a sectional view of the layer stack according to FIG. 2 after an additional structuring, and a subsequent conformally deposited layer.

In connection with FIG. 3, a gate electrode 22 is structured. First the second layer 20 is structured. The trench 36 is formed such that a sidewall 21 forms in the second layer 20. The sidewall 21 extends substantially perpendicular to the substrate surface 6.

A silicon layer 55 is then conformally deposited in the trench 36, on the exposed portions of the first layer 15, on the already structured sidewall 21 of the second layer 20, and on the mask layer 25.

Figure 4:
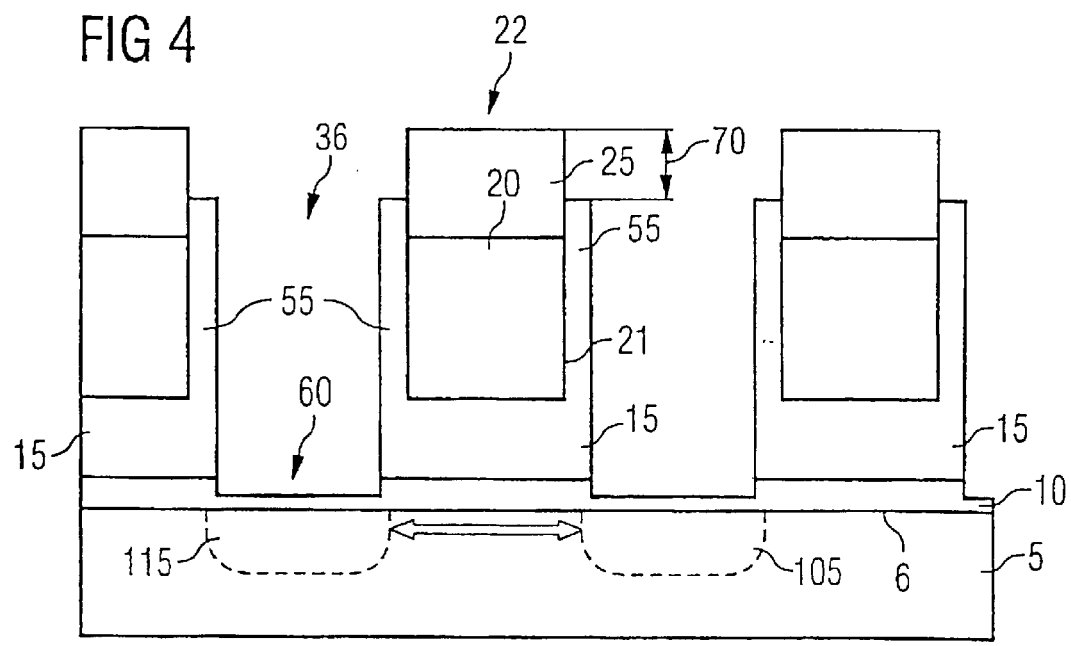
FIG. 4 is a sectional view of the configuration according to FIG. 3, after an additional etching step.

In connection with FIG. 4, the layer 55 containing silicon is etched back anisotropically, so that the layer 55 containing silicon is formed as a spacer at the sidewall 21 of the structured second layer 20 of the gate electrode. The layer 55 containing silicon is thus sunk into the trench 36 to the depth of a first depression 70. The first gate electrode 15 is also structured by the anisotropic etching, whereby the gate oxide 10 in the trench 36 is exposed. Next, a doping region 105 for the source or drain of the MOS transistor and a doping region 115 for the drain or source, respectively, can be incorporated into the substrate 5 by implantation.

Figure 5:
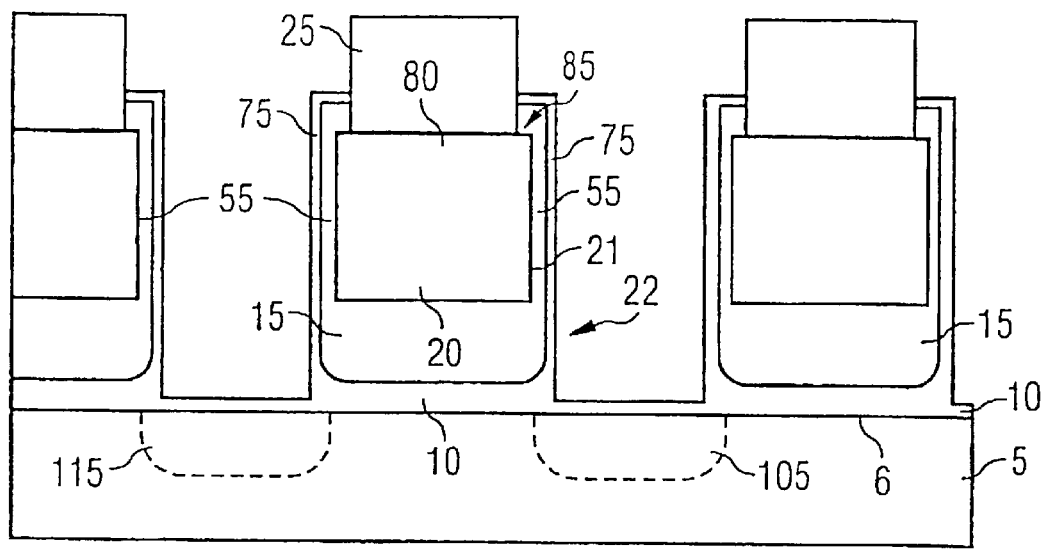
FIG. 5 is a sectional view of the configuration according to FIG. 4 after an oxidation step.

In connection with FIG. 5, a thermal oxidation is then performed, whereby a silicon oxide layer 75 forms on the clear regions of the first layer 15 of the gate electrode and the layer 55 containing silicon. At the same time, polycrystallization or phase conversions can take place, depending on the stoichiometry of the structured second layer 20 of the gate electrode and the first layer 15 of the gate electrode. As a result, the second layer 20 of the gate electrode deforms, and a protrusion 85 forms. A surface of the protrusion or bulge is covered with the silicon first layer 55, so that it is generally not oxidized. If, for example, the second layer 20 of the gate electrode is formed from tungsten silicide, then the first layer 15 of the gate electrode, which is formed from polycrystalline silicon, and the layer 55 containing silicon will consume some of the tungsten silicide layer in the oxidizing temperature step, which consequently expands and goes into a slightly substoichiometric phase. This prevents greater bulging of the tungsten silicide layer, whereby the reliability of the inventive field effect transistors is substantially improved with respect to shorts between the gate electrode and the contact that will be subsequently formed.

Figure 6:
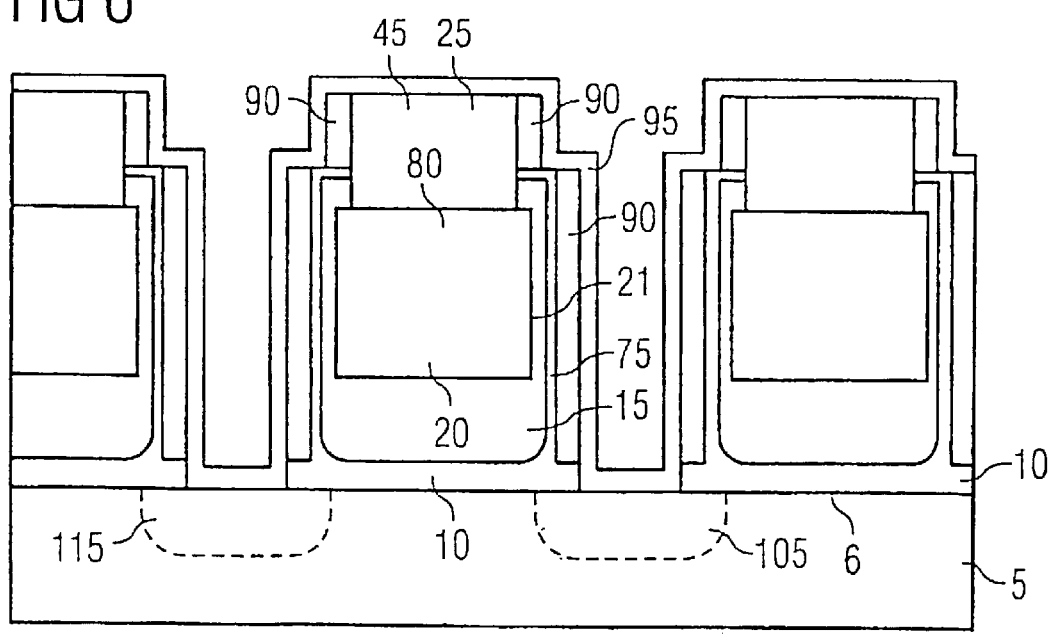
FIG. 6 is a sectional view of the configuration according to FIG. 5 with additionally deposited liners and spacers.

In connection with FIG. 6, a first insulation layer 90 of silicon nitride is advantageously deposited and etched back with the aid of anisotropic etching, so that the first insulation layer 90 of spacer-type structures is formed in the trench 36. Next, a first liner layer 95 is conformally deposited, which consists of silicon oxynitride, for instance.

In connection with FIG. 7, the structure from FIG. 6 is first filled and covered with a silicon oxide 101, and a via 102 is then etched until the doping region 105 is reached and exposed. The via 102 is then filled with a contact plug or contact stopper 100. In the via etching process, the first liner layer 95 and the first insulation layer 90 are attacked laterally, but a sufficient safety gap exists between the contact plug 100 and the tempered second gate electrode 80.

FIG. 8 represents a second variant of the inventive method, which follows FIG. 3. An insulating spacer 110 is formed, preferably from silicon nitride, at the substantially vertical sidewalls of the gate electrode by conformal deposition and anisotropic etch-back.

In connection with FIG. 9, the first gate electrode 15 and the deposited layer 55 containing silicon are anisotropically etched, whereby the gate oxide 10 is exposed and a depression 125 is formed between the insulating spacer 110 and the mask layer 25. The depression 125 is sunk relative to the top edge of the isolating spacer to a depth 70. With the structuring, the gate stack is formed with a fifth dimension 120, which is oriented horizontally and parallel to the substrate surface.

In connection with FIG. 10, a thermal oxidation is then performed, whereby an oxide layer 75 is formed at the first layer 15 of the gate electrode and on the layer 55 containing silicon. The oxide layer 75 insulates the first layer 15 of the gate electrode.

Figure 11:
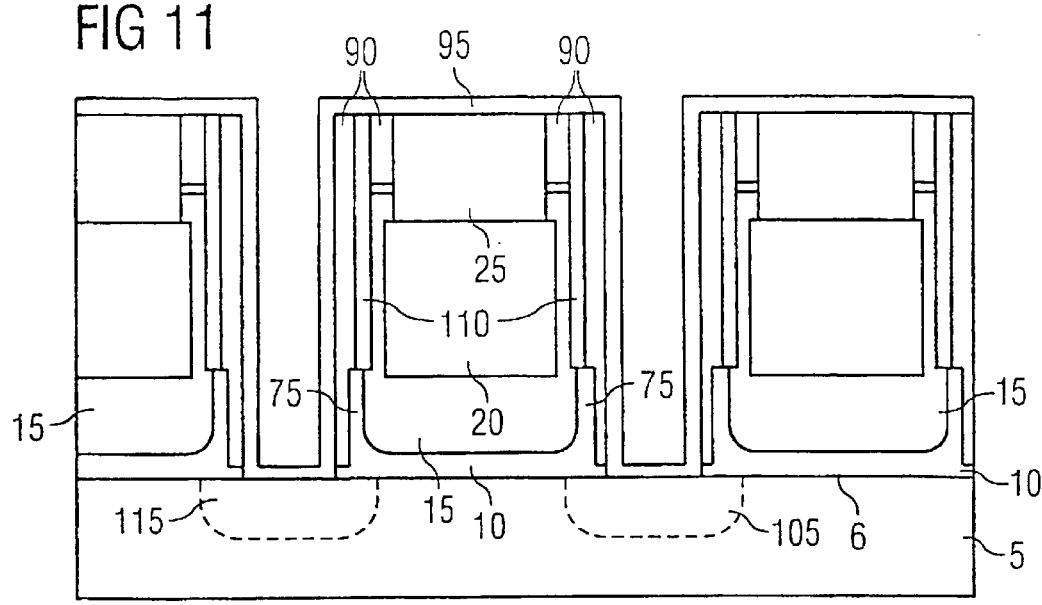
FIG. 11 is a sectional view of the configuration according to FIG. 10 after the disconnection of liners and spacers.

In connection with FIG. 11, the first insulation layer 90, preferably a silicon nitride layer, is then deposited and thus fills the depression 125. The first insulation layer 90 is formed as a spacer at the insulating spacer 110, whereby a massive and widespread insulating layer of silicon nitride is disposed next to the hard mask. Next, a liner layer 95, preferably a silicon oxynitride layer, is conformally deposited.

Figure 12:
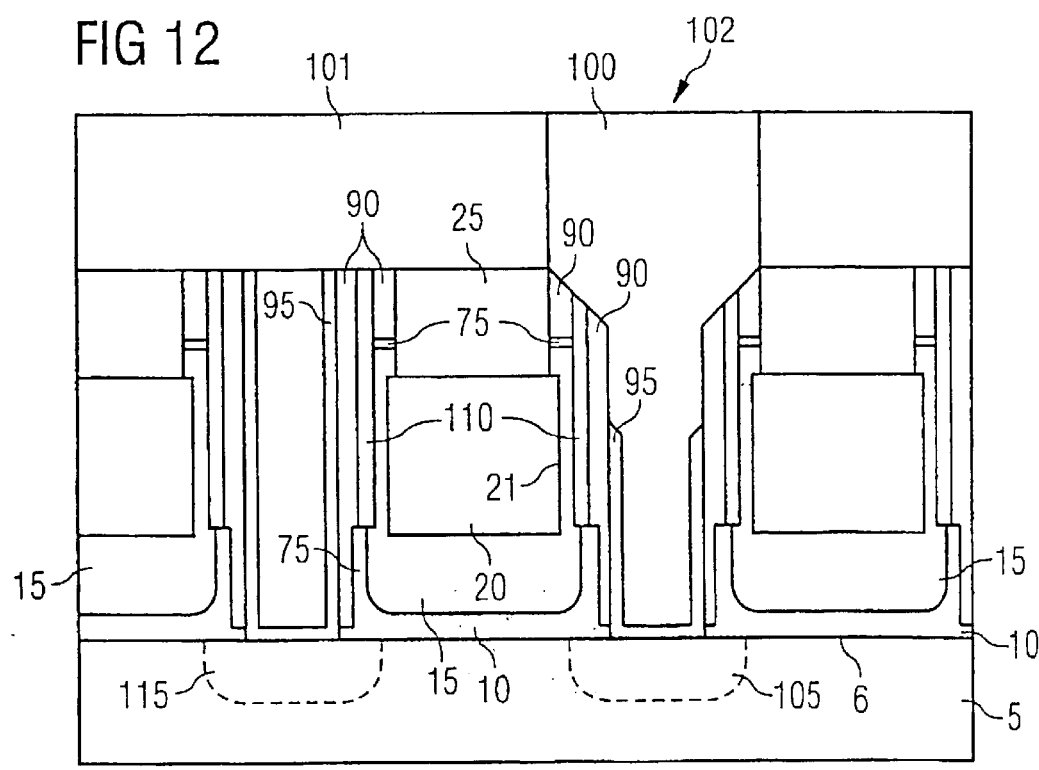
FIG. 12 is a sectional view of the configuration according to FIG. 11 with a contact plug.

In connection with FIG. 12, the structure from FIG. 11 is filled with silicon oxide 101. Next, the via 102 is etched, which exposes the doping region 105. The via 102 is then filled with the contact plug 100. In the via etching process, the sidewall 21 of the second gate electrode 20 is guarded by the first insulation layer 90, the isolating spacer 110, and the first insulation layer 90 which fills the depression 125.

Figure 13:
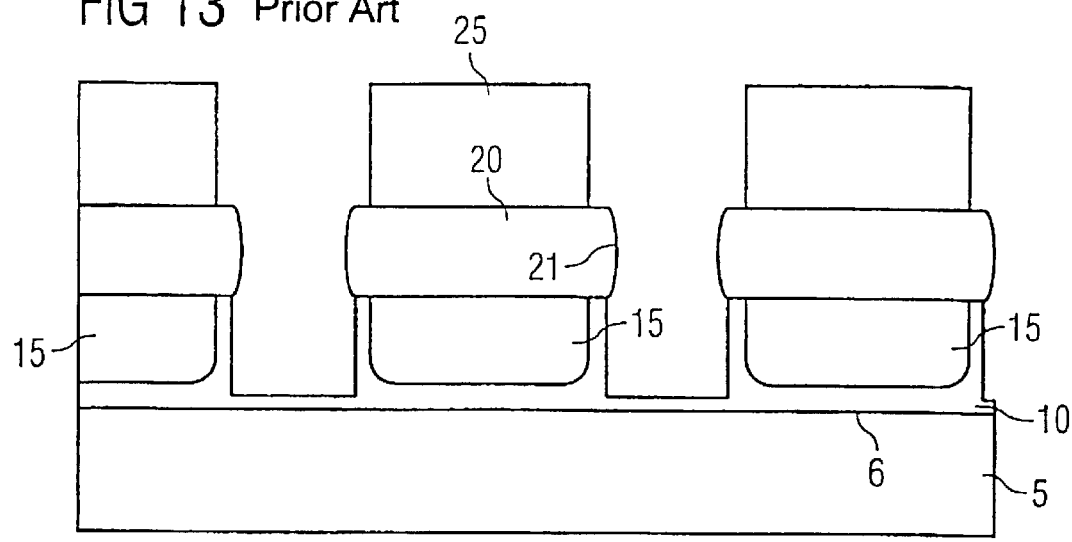
FIG. 13 is a sectional view of the configuration according to the prior art containing a protruding second gate electrode.

In connection with FIG. 13, a configuration according to the prior art is represented, in which the tungsten silicide layer 20 has been oxidized by the thermal oxidation into tungsten oxide and recrystallized. As a result, an enormous protrusion emerges at the sidewall 21.

Figure 14:
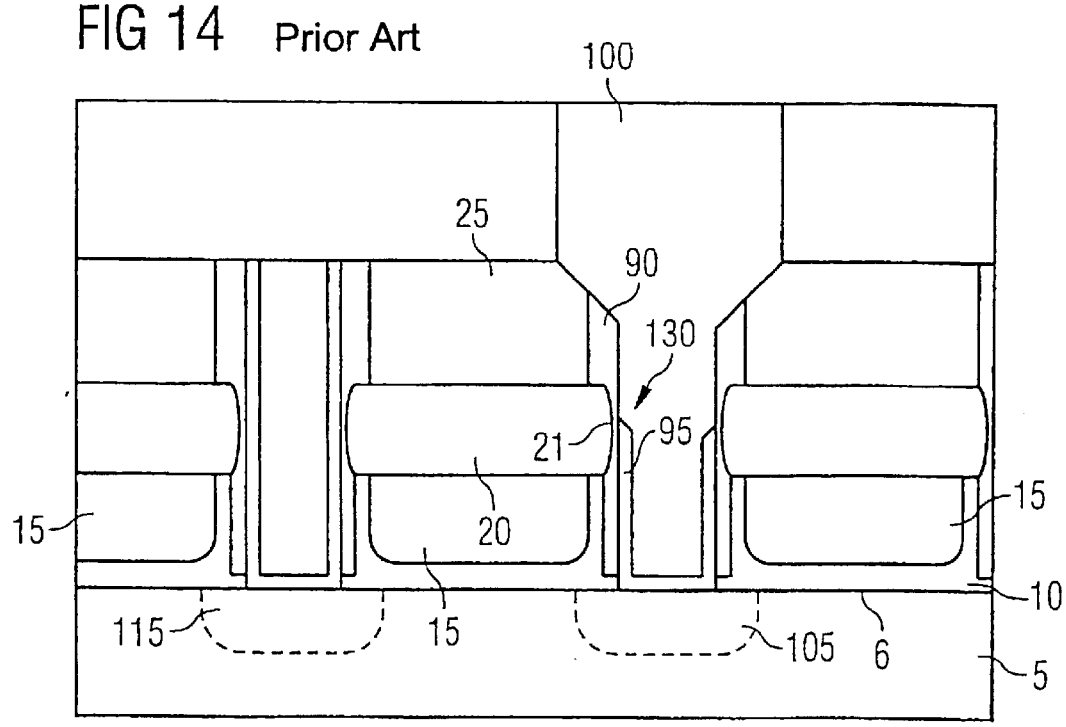
FIG. 14 is a sectional view of the configuration according to FIG. 13 with a contact plug.

In connection with FIG. 14, a critical thickness 130 emerges, which can lead to error functions of the field effect transistors according to the prior art.

We claim:

1. A method for fabricating a field effect transistor, which comprises the steps of:

providing a substrate having a surface;

forming a gate oxide on the surface;

depositing a first layer for a gate electrode on the gate oxide, the first layer containing a polycrystalline doped silicon;

depositing a second layer for the gate electrode on the first layer;

structuring the second layer, leaving the first layer at least partly clear and forming a sidewall at the second layer extending substantially perpendicular to the surface of the substrate;

depositing a layer containing silicon on the sidewall of the second layer and on an exposed portion of the first layer;

performing a structuring step such that the first layer gets structured and the structuring extends into the gate oxide but leaving intact the layer containing silicon at the sidewall of the second gate electrode;

incorporating a dopant into the substrate forming a first doping region and a second doping region;

forming an insulating spacer layer on the sidewall of the second layer extending to the first and second doping regions; and forming a contact adjoining the insulating spacer layer, the contact makes contact with one of the first and second doping regions.

2. The method according to claim 1, which comprises performing a thermal oxidation after the layer containing silicon is applied.

3. The method according to claim 1, which comprises depositing a silicon nitride layer as the insulating spacer layer.

4. The method according to claim 1, which comprises depositing a silicon oxynitride layer on the insulating spacer layer as an insulating liner layer.

5. The method according to claim 1, which comprises:

depositing an additional insulating layer on the layer containing silicon; and etching back the additional insulating layer resulting in the additional insulating layer functioning as a spacer before the first layer of the gate electrode is structured.

* * * * *